(12) United States Patent
Ko (10) Patent No.: US 7,948,808 B2
(45) Date of Patent: May 24, 2011

(54) DATA OUTPUT CIRCUIT FOR SEMICONDUCTOR MEMORY DEVICE

(75) Inventor: Bok Rim Ko, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 141 days.

(21) Appl. No.: 11/776,649

(22) Filed: Jul. 12, 2007

(65) Prior Publication Data

US 2008/0062772 A1 Mar. 13, 2008

(30) Foreign Application Priority Data

Sep. 7, 2006 (KR) .................. 10-2006-0086448

(51) Int. Cl.
*G11C 7/10* (2006.01)
(52) U.S. Cl. ......... 365/189.05; 365/189.02; 365/230.02; 365/191; 365/198
(58) Field of Classification Search ............. 365/230.02, 365/230.06, 185.13, 189.02, 230.03
See application file for complete search history.

(56) References Cited

U.S. PATENT DOCUMENTS

| | | | | |
|---|---|---|---|---|
| 5,406,525 A | * | 4/1995 | Nicholes | 365/230.02 |
| 5,610,864 A | * | 3/1997 | Manning | 365/193 |
| 6,064,600 A | * | 5/2000 | Manning | 365/189.02 |
| 6,233,173 B1 | * | 5/2001 | Chevallier et al. | 365/185.03 |
| 6,815,258 B2 | | 11/2004 | Vincent | |
| 6,965,520 B1 | * | 11/2005 | Seshadri et al. | 365/145 |
| 6,965,539 B2 | * | 11/2005 | Lee | 365/185.17 |
| 6,987,704 B2 | * | 1/2006 | Park | 365/185.17 |
| 7,327,613 B2 | * | 2/2008 | Lee | 365/189.02 |
| 7,505,351 B2 | * | 3/2009 | Kwon | 365/230.03 |
| 2002/0105853 A1 | * | 8/2002 | Naven | 365/233 |

FOREIGN PATENT DOCUMENTS

| | | |
|---|---|---|
| JP | 2005-353672 | 12/2005 |
| KR | 2001-0054743 A | 7/2001 |
| KR | 1020050034383 A | 4/2005 |
| KR | 2005-0047138 A | 5/2005 |
| KR | 1020050052725 A | 6/2005 |

* cited by examiner

*Primary Examiner* — Pho M Luu
*Assistant Examiner* — Tha-O Bui
(74) *Attorney, Agent, or Firm* — Ladas & Parry LLP

(57) ABSTRACT

The present invention relates to a semiconductor memory, and more specifically, to a data output circuit capable of differentiating global data lines in accordance to an operation mode to output them to a data input/output pin. The present invention includes: a multiplexer selecting any one of a plurality of global input/output lines which can receive variable data bandwidth directed by control signals and which can output data carried on the selected global input/output line, and a controller generating the control signals in accordance to operation mode signals corresponding to a data bandwidth and address signals provided for selecting data and providing them to the multiplexer. Thereby, the present invention can realize an improved data read speed by reducing the loading of the global input/output line.

12 Claims, 6 Drawing Sheets

DATA OUTPUT CIRCUIT FOR SEMICONDUCTOR MEMORY DEVICE

CROSS-REFERENCE TO RELATED APPLICATIONS

The present application claims priority to Korean patent application number 10-2006-0086448 filed on Sep. 7, 2006, which is incorporated herein by reference in its entirety.

BACKGROUND OF THE INVENTION

The present invention relates to a semiconductor memory device, and more specifically to a data output circuit differentiating global data lines according to an operation mode to output them to data input/output pins.

In general, in the case of a semiconductor memory device such as DDR SDRAM, it includes thirty-two data input/output pins (DQ) and thirty-two global input/output lines gin to support (X32, X16, and X8) data width options.

Herein, an operation mode X32 uses thirty-two data input/output pins (DQ), an operation mode X16 uses sixteen data input/output pins (DQ), and an operation mode X8 uses eight data input/output pins (DQ).

Accordingly, when data is read in the semiconductor memory device, an assignment of the corresponding data input/output pin (DQ) per a global input/output line (gio) can be changed according to an operation mode, that is, data width option. For example, in the operation mode X32, the data signals output from the respective global input/output lines (gio) are connected one to one to the data input/output pins (DQ) However, in the operation mode X16 or X18, any one of the data signals output to a plurality of global input/output lines gio is selected to be transferred to a specific data input/output pin (DQ). A circuit performing such a multiplexing process to select and transfer data to the data input/output pin (DQ) is a data output circuit.

Figure 1:
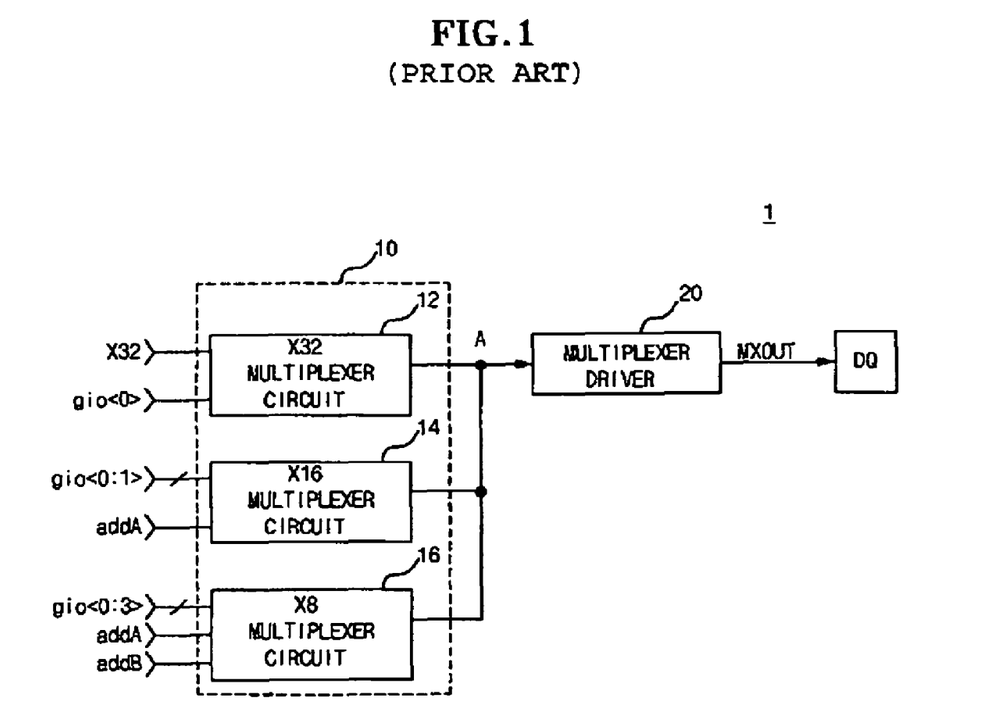
FIG. 1 depicts a block view showing a conventional data output control circuit.

FIG. 1 is a block view showing a data output circuit of a conventional semiconductor memory device, wherein it shows a structure that performs a multiplexing corresponding to four global input/output lines (gio<0:3>) to support the operation modes X32, X16, and X8. Therefore, eight data output circuits as in FIG. 1 are further included.

Referring to FIG. 1, the data output circuit 1 is includes a multiplexer circuit 10 and a multiplexer driver 20.

The multiplexer circuit 10 comprises an X32 multiplexer 12, an X16 multiplexer 14, and an X8 multiplexer 16, of which output terminals are commonly connected to a node A.

The X32 multiplexer 12 selects and outputs the data of a global input/output line (gio<0>) in response to the operation mode X32, the X16 multiplexer 14 selects and outputs any one of the data of a global input/output lines (gio<0:1>) in response to the operation mode X16, and the X8 multiplexer 16 selects and outputs any one of the data of global input/output lines (gio<0:3>) in response to an operation mode X8.

The multiplexer driver 20 transfers MUX output signals (MXOUT) amplifying data signals output from a node A to the data input/output pins (DQ).

Figure 2A:
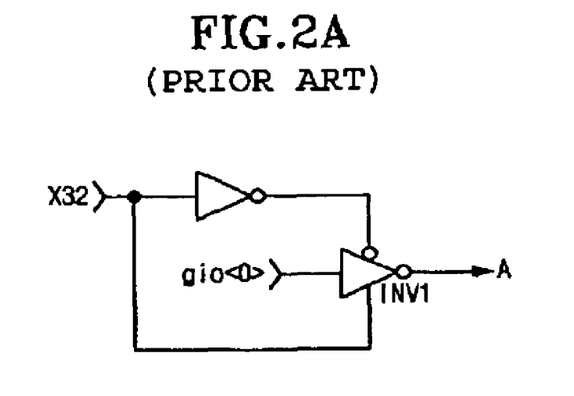
FIGS. 2a to 2c depict circuit views showing an X32 multiplexer, an X16 multiplexer, and an X8 multiplexer constituting the multiplexer of FIG. 1.
Figure 2B:
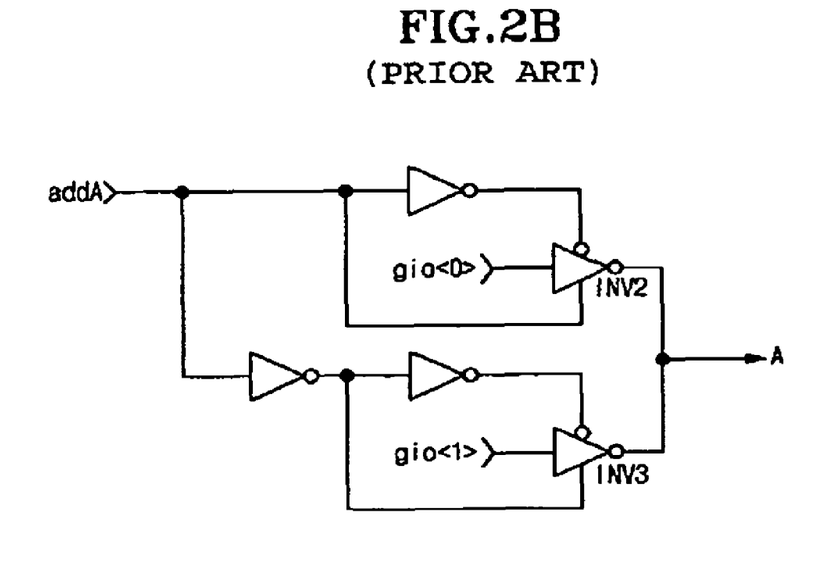
Figure 2C:
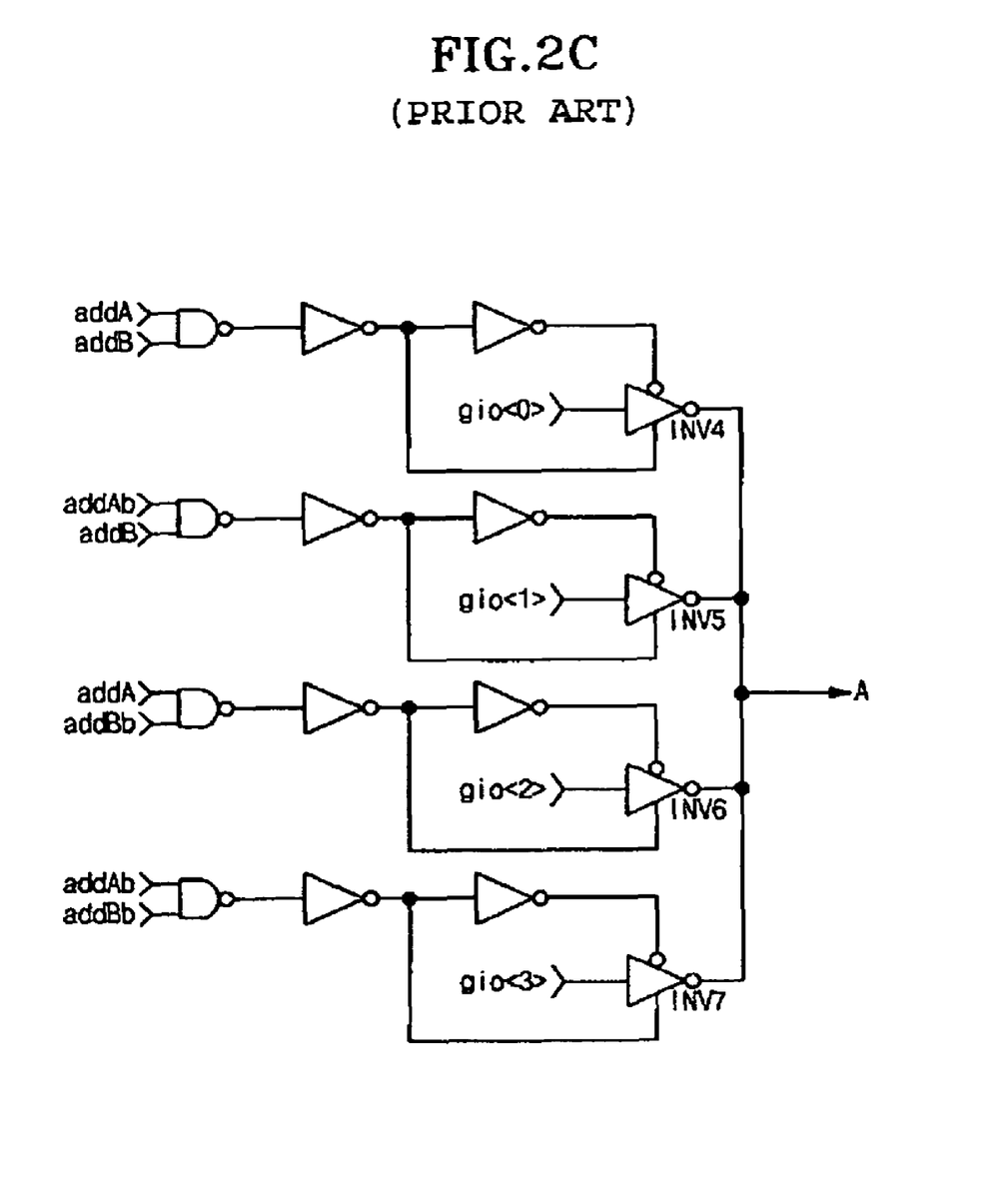

FIGS. 2a to 2c are views showing each constitution of an X32 multiplexer 12, an X16 multiplexer 14, and an X8 multiplexer 16 constituting the multiplexer circuit 10 of FIG. 1.

First, referring to FIG. 2a, the X32 multiplexer 12 comprises a tri-state inverter (INV1) input with data signals of the global input/output line (gio<0>) and applies an operation mode X32 and an inverted operation mode X32 to the tri-state inverter to control the output of the tri-state inverter (INV1).

Therefore, the X32 multiplexer 12 outputs the data signal of the global input/output line (gio<0>).

Next, referring to FIG. 2b, the X16 multiplexer 14 comprises tri-state inverters (INV2 and INV3). Each tri-state inverter is inputted with data signals of global input/output lines (gio<0:1>). A first address signal addA applied from the operation mode X16 controls the output of the tri-state inverters INV2 and INV3.

Therefore, the X16 multiplexer 14 outputs any one of the data signals of the global input/output lines (gio<0:1>). In other words, when the first address signal (addA) is in a high state, the data signal of the global input/output line (gio<0>) is output by turning on the tri-state inverter (INV2), and when the first address signal (addA) is in a low state, the data signal of the global input/output line (gio<1>) is output by turning on the tri-state inverter (INV3).

Referring to FIG. 2c, the X8 multiplexer 16 comprises tri-state inverters (INV4, INV5, INV6, and INV7), in which each input with data signals of global input/output lines (gio<0:3>). A first and second address signals addA and addB applied from an operation mode X8 controls the output of the tri-state inverters (INV4, INV5, INV6, and INV7).

Therefore, the X8 multiplexer 16 outputs any one of the data signals of the global input/output lines (gio<0:3>). In other words, when both the first and second address signals (addA and addB) are in a high state, the data signals of the global input/output line (gio<0>) are output by turning on the tri-state inverter (INV4), and when the first address signal (addA) is in a low state and the second address signal (addB) is in a high state, the data signal of the global input/output line (gio<1>) is output by turning on the tri-state inverter (INV5). And, when the first address signal (addA) is in a high state and the second address signal (addB) is in a low state, the data signal of the global input/output line (gio<2>) is output by turning on the tri-state inverter (INV6), and when both the first and second address signals (addA and addB) are in a low state, the data signal of the global input/output line (gio<3>) is output by turning on the tri-state inverter (INV7).

As described above, the conventional data output circuit comprises the plurality of multiplexers (X32, X16, and X8), and selectively operates any one multiplexer thereof according to the operation modes so that the selected multiplexer selects and outputs the signals of the corresponding global input/output lines and amplifies them in response to the multiplexer driver 20 to transfer them to the data input/output pin (DQ).

However, in the conventional data output circuit, some of the data signals of the global input/output lines (gio<0:3>), for example, the data signal of the global input/output line (gio<0>), is commonly connected to the plurality of multiplexers (X32 multiplexer 12, X16 multiplexer 14, and X8 multiplexer 16), the entire loading of the global input/output line (gio<0>) becomes large, thereby, causing a problem that the delay occurs.

Also, the signals of the output terminal node A are connected to a gate cap of the multiplexer driver 20 as well as the plurality of multiplexers (X32 multiplexer 12, X16 multiplexer 14, and X8 multiplexer 16) constituting the neighboring multiplexer circuit 10, causing a problem that delay increases due to the affect of the junction cap existing therebetween.

Therefore, such an increase of delay slows down the data read speed of the semiconductor memory device so that it serves as an obstacle in increasing the data read speed of the semiconductor memory device.

SUMMARY OF THE INVENTION

The present invention provides a data output circuit of a semiconductor memory device implementing a single multiplexer supporting various operation modes and generating control signals in response to operation mode signals and to data selection signals in which the data output circuit uses a controller to control the output of the single multiplexer whereby reducing the loading of a global input/output line and making it possible to improve a data read speed.

The present invention also provides a data output circuit of a semiconductor memory device implementing a single multiplexer to reduce a junction cap of the signals output from the multiplexer, thereby improving a data read speed.

The present invention provides a data output circuit of a semiconductor memory device implementing a single multiplexer to improve the size of the data output circuit.

The data output circuit of a semiconductor memory device according to the present invention comprises: a multiplexer which selectively outputs signals of a plurality of global input/output lines in response to control signals; and a controller generating the control signals in response to operation mode signals corresponding to a data bandwidth and to address signals provided for data selection.

Also, a data output circuit of a semiconductor memory device according to the present invention comprises: a multiplexer which can selectively output signals of a plurality of global input/output lines in response to control signals; a controller generating the control signals in response to operation mode signals corresponding to a data bandwidth and address signals provided for data selection and providing the control signals and the address signals to the multiplexer; and a multiplexer driver amplifying the output of the multiplexer to transfer the output to a data input/output pin.

Preferably, the multiplexer comprises a switching unit selectively outputting the corresponding outputted data signal in response to the control signals through the respective global input/output lines.

Preferably, the switching unit comprises an inverter inverting the control signals, and a tri-state inverter, or a pass gate, the pass gate having input/output terminals of a PMOS transistor and a NMOS transistor are connected to each other. One terminal of the tri-state inverter or the pass gate is applied with the control signals inverted by the inverter and the other terminal thereof is applied with the control signals in order to control the output of the data.

The controller is applied with operation mode signals including an operation mode X32 corresponding to 32 bits data width, an operation mode X16 corresponding to 16 bits data width, and an operation mode X8 corresponding to 8 bits data width, and address signals including a first address signal and a second address signal for selecting the data applied to the multiplexer so that it outputs any one of a first to fourth control signals to be high.

The controller comprises a first generator generating the first control signal output to be in a high state when the first address signal is in a low state in the operation mode X32 and the operation mode X16, and both the first and second address signals are in a low state in the operation mode X8; a second generator generating the second control signal to be in a high state when the first address signal is in a low state in the operation mode X16, and the first address signal is high and the second address signal is in a low state in the operation mode X8; and a third generator generating the third control signal to be in a high state when the first address signal is in a low state and the second signal is in a high state in the operation mode X8, and generating the fourth control signal to be in a high state when both the first and second address signals are in a high state in the operation mode X8.

Herein, the first generator comprises a first inverter inverting an inverted X32 signal; a first NOR gate NOR-coupling together an inverted X16 signal to a first additional signal; a NAND gate NAND-coupling together inverted first and second additional signals; a second NOR gate NOR-coupling together the output of the NAND gate to the inverted X8 signal; a third NOR gate NOR-coupling together the output of the first inverter to the output of the first and second NOR gates; and a second inverter inverting the output of the third NOR gate and outputting the first control signal.

And, the second generator comprises a first NOR gate NOR-coupling together an inverted X16 signal to an inverted first additional signal; a NAND gate NAND-coupling together a first additional signal to an inverted second additional signal; a second NOR gate NOR-coupling together the output of the NAND gate to an inverted X8 signal; a third NOR gate NOR-coupling together the output of the first and second NOR gates; and an inverter inverting the output of the third NOR gate and outputting the second control signal.

Finally, the third generator comprises: a first inverter inverting an inverted X8 signal; a first NAD gate NAND-coupling together an inverted first additional signal to a second additional signal; a second inverter inverting the output of the first NAND gate; a second NAND gate NAND-coupling together first and second additional signals; a third inverter inverting the output of the second NAND gate; a third NAND gate NAND-coupling together the inverted X8 signal to the output of the second inverter; a fourth inverter inverting the output of the third NAND gate and outputting the third control signal; a fourth NAND gate NAND-coupling together the inverted X8 signal to the output of the third inverter; and a fifth inverter inverting the output of the fourth NAND gate and outputting the fourth control signal.

DESCRIPTION OF SPECIFIC EMBODIMENTS

Hereinafter, preferred embodiments of the present invention will be described in detail with reference to the accompanying drawings.

Figure 3:
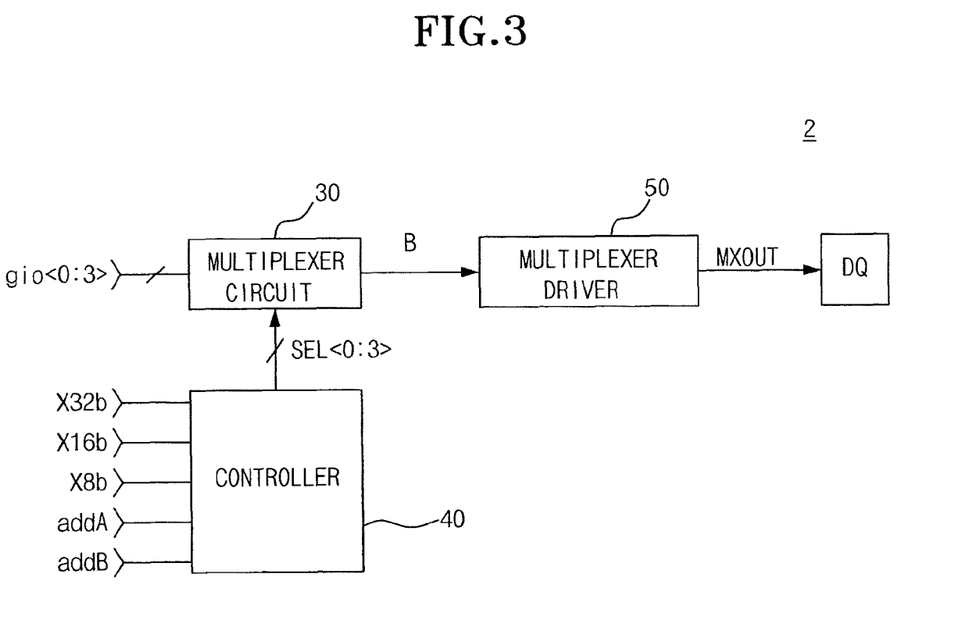
FIG. 3 depicts a block view showing a data output circuit of a semiconductor memory device according to the present invention.

FIG. 3 depicts a block view showing a data output circuit of a semiconductor memory device according to the present invention. It shows a structure to support operation modes X32, X16, and X8 by performing a multiplexing corresponding to four global input/output lines (gio<0:3>). Therefore, it is preferable that eight data output circuits as in FIG. 3 are further included.

Referring to FIG. 3, the data output circuit 2 is includes a multiplexer circuit 30, a controller 40, and a multiplexer driver 50.

The multiplexer circuit 30 controls the output of the data signals of a global input/output lines (gio<0:3>) by means of control signals (SEL<0:3>).

The controller 40 generates the control signals (SEL<0:3>) in response to operation mode signals X32, X16, and X8 and in response to data selection signals addA and addB.

The multiplexer driver 50 transfers MUX output signals (MXOUT) generated by amplifying the signals output from the multiplexer circuit 30 to a data input/output pin (DQ).

Figure 4:
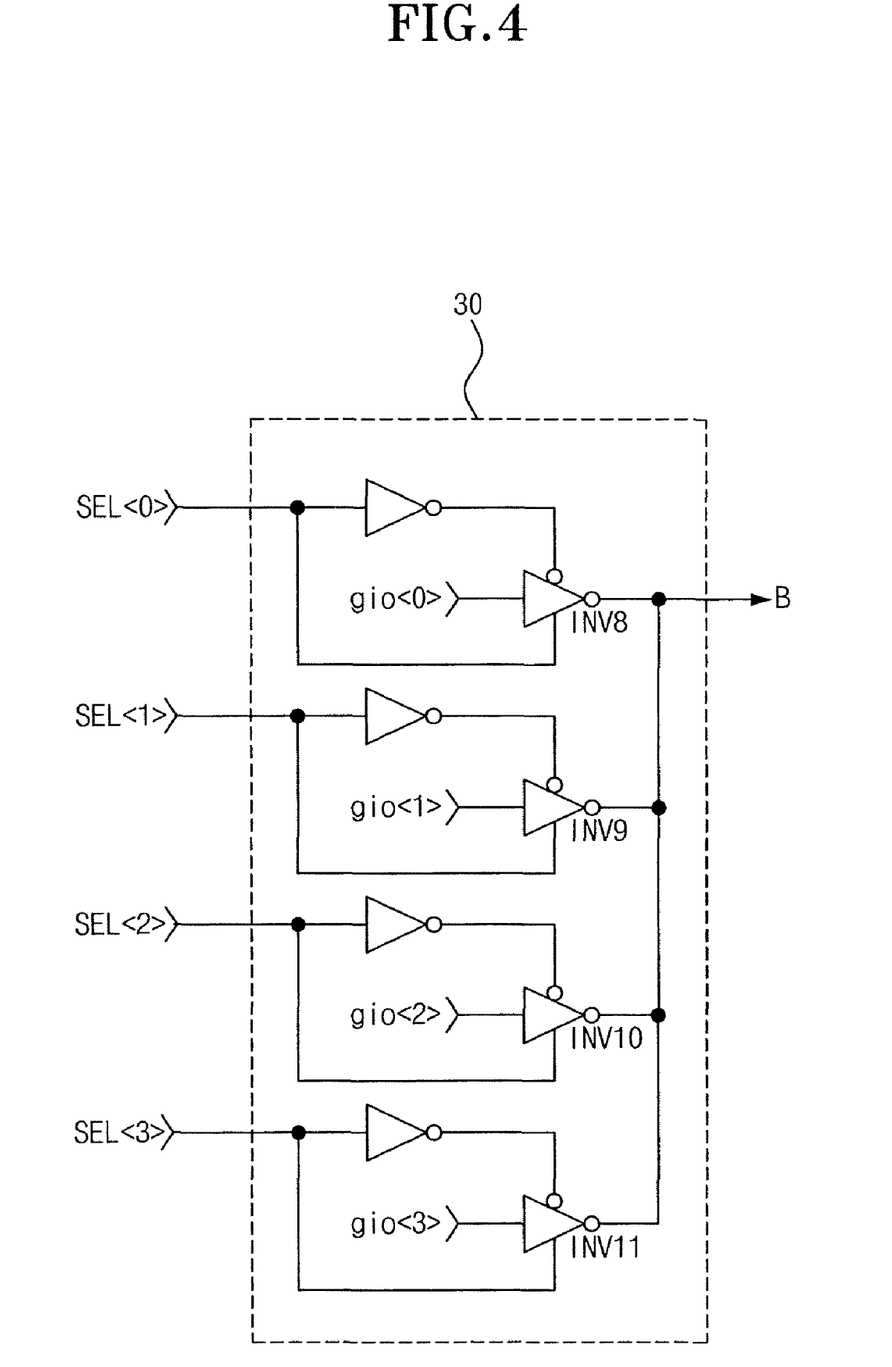
FIG. 4 depicts a circuit view showing the multiplexer of FIG. 3.

Referring to FIG. 4, the multiplexer 30 includes tri-state inverters (INV9 to INV11) applied with data signals of the respective global input/output lines (gio<0:3>) to selectively output of the data signal in response to control signals (SEL<0:3>). The output terminals of these tri-state inverters (INV8 to INV11) are commonly connected to a node B.

When the control signal (SEL<0>) is in a high state, the tri-state inverter (INV8) is turned on to output the signals of the global input/output line (gio<0>) input therewith to an output terminal node B. In the same manner, when the control signal (SEL<1>) is in a high state, the tri-state inverter (INV9) is turned on to output the signals of the global input/output line (gio<1:3>) to the output terminal node B; when the control signal (SEL<2>) is in a high state, the tri-state inverter (INV10) is turned on to output the signals of the global input/output line (gio<1:3>) to the output terminal node B; and when the control signal (SEL<3>) is in a high state, the tri-state inverter 11 is turned on to output the signals of the global input/output lines (gio<1:3>) to the output terminal node B.

To this end, the controller 40 outputs the control signal (SEL<0>) to be in a high state in the operation mode X32, and any one of the control signals (SEL<0:1>) to be in a high state in the operation mode X16 and any one of the control signals (SEL<0:3>) to be in a high state in the operation mode X8.

Figure 5:
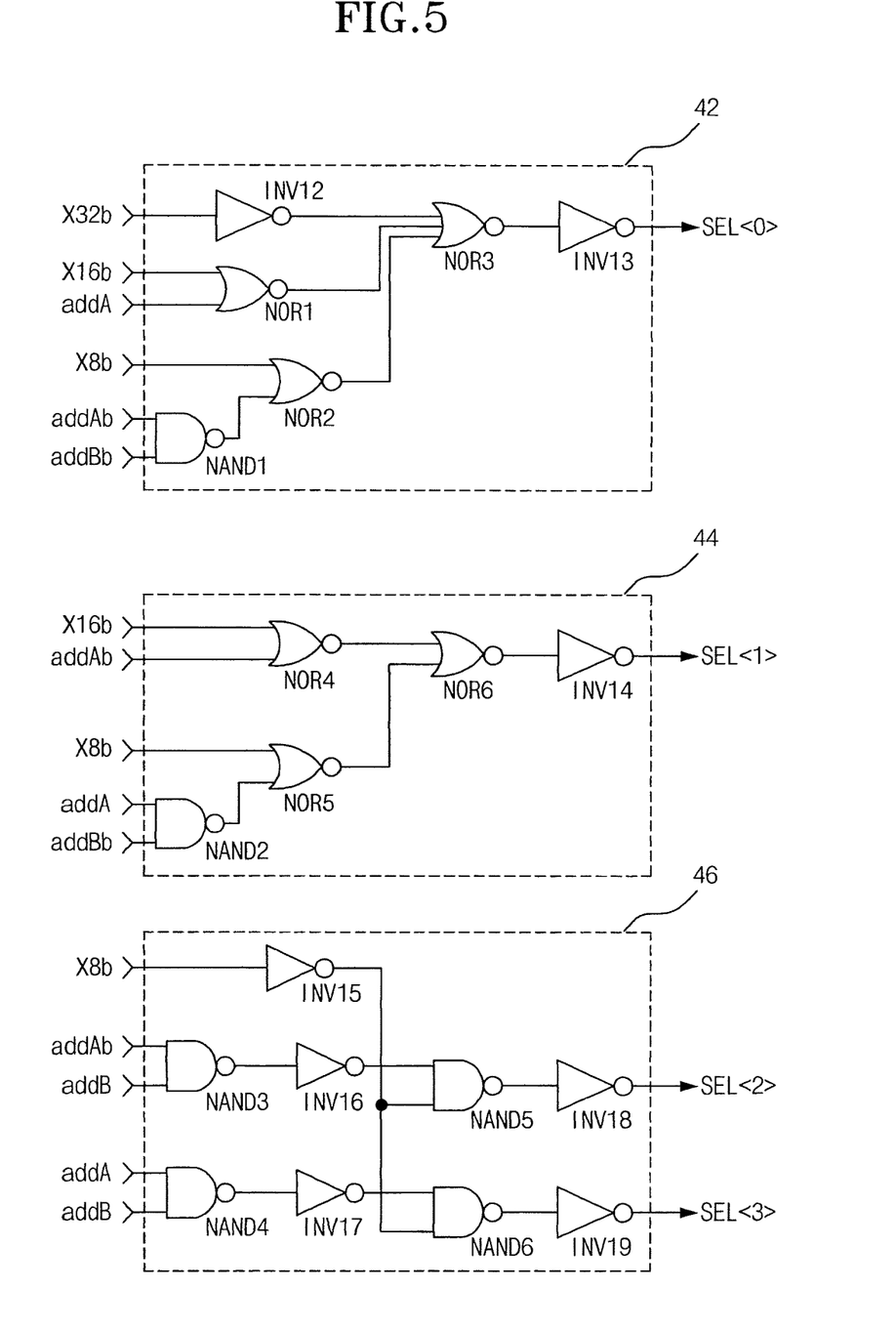
FIG. 5 depicts a circuit view showing the controller of FIG. 3.

Referring to FIG. 5, the controller 40 includes a first generator 42 generating the control signal (SEL<0>), a second generator 44 generating the control signal (SEL<1>), and a third generator 46 generating the control signal (SEL<2:3>).

First, the first generator 42 is includes an inverter (INV12) back inverting the X32b that the operation mode X32 is inverted; a NOR gate (NOR1) NOR-coupling together an X16b that the operation mode X16 is inverted to a first address signal (addA); a NAND gate (NAND1) NAND-coupling together the inverted first and second address signals (addAb and addBb); a NOR gate (NOR2) NOR-coupling together the output of the NAND gate (NAND1) to X8b; a NOR gate (NOR3) back NOR-coupling together the output of the inverter (INV12) to the outputs of the NOR gates (NOR1 and NOR2); and an inverter (INV13) inverting the output of the NOR gate (NOR3) and outputting the control signal (SEL<0>).

Accordingly, the first generator 42 outputs the control signal (SEL<0>) to be in a high state when in the operation mode X32 and the operation mode X16, the first address signal (addA) is in a low state and when in the operation mode X8, both the first and second address signals (addA and addB) are in a low state, or otherwise, outputs the control signal (SEL<0>) at a low state.

Next, the second generator 44 includes a NOR gate (NOR4) NOR-coupling together the X16b that the operation mode X16 is inverted to the inverted first address signal (addAb); a NAND gate (NAND2) NAND-coupling together the first address signal (addA) to the inverted second address signal (addBb); a NOR gate (NOR5) NOR-coupling together the output of the NAND gate (NAND2) to the X8b that the operation mode X8 inverted; a NOR gate (NOR6) back NOR-coupling together the outputs of the NOR gates (NOR4 and NOR5); and an inverter (INV14) inverting the output of the NOR gate (NOR6) and outputting the control signal (SEL<1>).

Accordingly, the second generator 44 outputs the control signal (SEL<1>) to be in a high state when in the operation mode X16, the first address signal (addA) is in a low state and when in the operation mode X8, the first address signal (addA) is in a high state and the second address signal (addB) is in a low state, or otherwise, outputs the control signal (SEL<1>) at a low state.

Next, the third generator 46 includes an inverter (INV15) back inverting the X8b that the operation mode X8 inverted; a NAND gate (NAND3) NAND-coupling together the inverted first address signal (addAb) and the second address signal (addB); an inverter (INV16) inverting the output of the NAND gate (NAND3); an NAND gate (NAND4) NAND-coupling together the first and second address signals (addA and addB); an inverter (INV17) inverting the output of the NAND gate (NAND4); an NAND gate (NAND5) NAND-coupling together the X8b to the output of the inverter (INV16); an inverter (INV18) inverting the output of the NAND gate (NAND5) and outputting the control signal (SEL<2>); a NAND gate (NAND6) NAND-coupling the X8b to the output of the inverter (INV17); and an inverter (INV19) inverting the output of the NAND gate (NAND6) and outputting the control signal (SEL<3>).

Accordingly, the third generator 46 outputs the control signal (SEL<2>) to be in a high state when in the operation mode X8, the first address signal (addA) is in a low state and the second address signal (addB) is in a high state and when in the operation mode X8, both the first and second address signals (addA and addB) are in a high state, outputs the control signal (SEL<3>) at a low state.

Thereby, the controller 40 outputs the control signal (SEL<0>) to be in a high state in the operation mode X32 according to the operation mode, and any one of the control signals (SEL<0:1) to be in a high state in the operation mode X16 according to the first address signal (addA0) and any one of the control signals (SEL<0:3>) to be in a high state in the operation mode X8 according to the first and second address signals (addA and addB) to control the tri-state inverters (INV8 to INV11) of the multiplexer, thereby outputting any one of the data signals of the global input/output lines (gio<0:3>).

In other words, the tri-state inverter (INV8) is controlled in response to the control signal (SEL<0>) in the operation mode X32 to output the data signal of the global input/output line (gio<0>), the tri-state inverters (INV8 to INV9) are controlled in response to the control signal (SEL<0:1>) in the operation mode X16 to output any one of the data signals of the global input/output lines (gio<0:1>), and the tri-state inverters (INV8 to INV11) are controlled in the operation mode X8 to output any one of the data signals of the global input/output lines (gio<0:3>).

Thereafter, the signal output to the output terminal node B is amplified in response to a multipexler driver 50 to transmit the signal output as a MUX output signal (MXOUT) to an input/output (DQ).

As such, all the data output circuits according to the embodiment of the present invention are the same and have a short path, until the respective input/output lines (gio<0:3>) reach the output terminal node B through the multiplexer 30.

Also, the junction cap (here, the tri-state inverters (INV8 to INV11) constituting the neighboring multiplexer 30 of the output terminal node B reduces as compared to the junction caps (here, the tri-state inverters (INV1 to INV7) constituting the plurality of neighboring multiplexers X32, X16, and X8) of the output terminal node A of the conventional data output circuit, thereby rapidly outputting the MUX output signal (MXOUT) and improving the size of the multiplexer driver 50 as well as the size of the data output circuit.

Accordingly, the present invention provides a data output circuit of a semiconductor memory device implementing a single multiplexer supporting various operation modes and generating control signals in response to operation mode signals and data selection signals using a controller to control the output of the single multiplexer so that it reduces the loading of a global input/output line, making it possible to improve a data read speed.

Also, the present invention provides a data output circuit of a semiconductor memory device implementing a single multiplexer to reduce a junction cap of the signals output from the multiplexer so that delay of MUX output signals is reduced, thereby improving a data read speed.

Also, the present invention realizes an improvement in the size of a semiconductor memory device by implementing a single multiplexer.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A data output circuit of a semiconductor memory device, comprising:
    a data output pin where a predetermined number of a plurality of global input/output lines is allocated;
    a multiplexer selectively outputting data signals from the predetermined number of the plurality of global input/output lines to the data output pin in response to control signals; and
    a controller generating the control signals in response to operation mode signals corresponding to the data bandwidth, and the address signals provided for data signal selection,
    wherein the operation mode signals comprises at least an operation mode X32 corresponding to 32 bits data width; an operation mode X16 corresponding to 16 bits data width; and an operation mode X8 corresponding to 8 bits data width,
    wherein the multiplexer comprises a switching unit selectively outputting the corresponding data signals in response to the control signals from the respective global input/output lines, and
    wherein the switching unit comprises an inverter inverting the control signals; and a tri-state inverter having one terminal receiving the control signals inverted by the inverter and having the other terminals receiving the control signals, wherein the switching unit controls the output of the data signals.

2. The data output circuit according to claim 1, wherein the operation mode signals include the operation mode X32 corresponding to 32 bits data width; the operation mode X16 corresponding to 16 bits data width; and the operation mode X8 corresponding to 8 bits data width; and address signals including a first address signal and a second address signal for selecting the data applied to the multiplexer so that the controller outputs any one of a first to fourth control signals to be in a high state.

3. The data output circuit according to claim 2, wherein the controller comprises:
    a first generator generating the first control signal output to be in a high state when the first address signal is in a low state in the operation mode X32 and the operation mode X16, and both the first and second address signals are in the low state in the operation mode X8;
    a second generator generating the second control signal to be in the high state when the first address signal is in the low state in the operation mode X16, and the first address signal is high and when the second address signal is in the low state in the operation mode X8; and
    a third generator generating the third control signal to be in the high state when the first address signal is in the low state and the second signal is in the high state in the operation mode X8, and generating the fourth control signal to be in the high state when both the first and second address signals are in the high state in the operation mode X8.

4. The data output circuit according to claim 3, wherein the first generator comprises:
    a first inverter inverting an inverted X32 signal;
    a first NOR gate NOR-coupling together an inverted X16 signal to a first additional signal;
    a NAND gate NAND-coupling together inverted first and second additional signals;
    a second NOR gate NOR-coupling together the output of the NAND gate to the inverted X8 signal;
    a third NOR gate NOR-coupling together the output of the first inverter to the output of the first and second NOR gates; and
    a second inverter inverting the output of the third NOR gate and outputting the first control signal.

5. The data output circuit according to claim 3, wherein the second generator comprises:
    a first NOR gate NOR-coupling together an inverted X16 signal to an inverted first additional signal;
    a NAND gate NAND-coupling together a first additional signal to an inverted second additional signal;
    a second NOR gate NOR-coupling together the output of the NAND gate to an inverted X8 signal;
    a third NOR gate NOR-coupling together the output of the first and second NOR gates; and
    an inverter inverting the output of the third NOR gate and outputting the second control signal.

6. The data output circuit according to claim 3, wherein third generator comprises:
    a first inverter inverting an inverted X8 signal;
    a first NAND gate NAND-coupling together an inverted first additional signal to a second additional signal;
    a second inverter inverting the output of the first NAND gate;
    a second NAND gate NAND-coupling together a first and second additional signals;
    a third inverter inverting the output of the second NAND gate;
    a third NAND gate NAND-coupling together the inverted X8 signal to the output of the second inverter;
    a fourth inverter inverting the output of the third NAND gate and outputting the third control signal;
    a fourth NAND gate NAND-coupling together the inverted X8 signal to the output of the third inverter; and
    a fifth inverter inverting the output of the fourth NAND gate and outputting the fourth control signal.

7. A data output circuit of a semiconductor memory device, comprising:
    a data output pin where a predetermined number of a plurality of global output/input lines is allocated;
    a multiplexer which selectively outputs date signals from the predetermined number of the plurality of global input/output lines in response to control signals;

a controller generating the control signals in response to operation mode signals corresponding to a data bandwidth, and address signals provided for data selection, wherein the controller receiving operation mode signals comprises at least an operation mode X32 corresponding to 32 bits data width, an operation mode X16 corresponding to 16 bits data width, and an operation mode X8 corresponding to 8 bits data width; and a multiplexer driver amplifying and transferring an output of the multiplexer to the data input/output pin, wherein the multiplexer comprises a switching unit selectively outputting the corresponding data signals in response to the control signals from the respective global input/output lines, and wherein the switching unit comprises: an inverter inverting the control signals; and a tri-state inverter having one terminal receiving the control signals inverted by the inverter and the other terminals receiving the control signals, wherein the controlling unit controls the output of the data signal.

8. The data output circuit according to claim 7, wherein the controller receiving operation mode signals including: the operation mode X32 corresponding to 32 bits data width; the operation mode X16 corresponding to 16 bits data width; and the operation mode X8 corresponding to 8 bits data width; and the controller receiving address signals including: a first address signal; and a second address signal wherein the controller selects the data applied to the multiplexer so that the controller outputs any one of a first to fourth control signals to be in the high state.

9. The data output circuit according to claim 8, wherein the controller comprises:

a first generator generating the first control signal output to be in the high state when the first address signal is in the low state in the operation mode X32 and the operation mode X16, and both the first and second address signals are in the low state in the operation mode X8;

a second generator generating the second control signal to be in the high state when the first address signal is in the low state in the operation mode X16, and the first address signal is in the high state and the second address signal is in the low state in the operation mode X8; and a third generator generating the third control signal to be in the high state when the first address signal is in the low state and the second signal is in the high state in the operation mode X8, and generating the fourth control signal to be in the high state when both the first and second address signals are in the high state in the operation mode X8.

10. The data output circuit according to claim 9, wherein the first generator comprises:

a first inverter inverting an inverted X32 signal;

a first NOR gate NOR-coupling together an inverted X16 signal to a first additional signal;

a NAND gate NAND-coupling together inverted first and second additional signals;

a second NOR gate NOR-coupling together the output of the NAND gate to the inverted X8 signal;

a third NOR gate NOR-coupling together the output of the first inverter to the output of the first and second NOR gates; and a second inverter inverting the output of the third NOR gate and outputting the first control signal.

11. The data output circuit according to claim 9, wherein the second generator comprises:

a first NOR gate NOR-coupling together an inverted X16 signal to an inverted first additional signal;

a NAND gate NAND-coupling together a first additional signal to an inverted second additional signal;

a second NOR gate NOR-coupling together the output of the NAND gate to an inverted X8 signal;

a third NOR gate NOR-coupling together the output of the first and second NOR gates; and an inverter inverting the output of the third NOR gate and outputting the second control signal.

12. The data output circuit according to claim 9, wherein the third generator comprises:

a first inverter inverting an inverted X8 signal;

a first NAD gate NAND-coupling together an inverted first additional signal to a second additional signal;

a second inverter inverting the output of the first NAND gate;

a second NAND gate NAND-coupling together a first and second additional signals;

a third inverter inverting the output of the second NAND gate;

a third NAND gate NAND-coupling together the inverted X8 signal to the output of the second inverter;

a fourth inverter inverting the output of the third NAND gate and outputting the third control signal.;

a fourth NAND gate NAND-coupling together the inverted X8 signal to the output of the third inverter; and a fifth inverter inverting the output of the fourth NAND gate and outputting the fourth control signal.

* * * * *